US005650652A

United States Patent [19]
Mizutani et al.

[11] Patent Number: 5,650,652
[45] Date of Patent: Jul. 22, 1997

[54] INPUT/OUTPUT PROTECTION CIRCUIT AND SEMICONDUCTOR DEVICE HAVING THE SAME

[75] Inventors: Toru Mizutani; Osamu Kobayashi, both of Kawasaki; Kunihiko Gotoh, Tama, all of Japan

[73] Assignee: Fujitsu Limited, Kawasaki, Japan

[21] Appl. No.: 687,832

[22] Filed: Jul. 26, 1996

Related U.S. Application Data

[63] Continuation of Ser. No. 410,393, Mar. 27, 1995, abandoned, which is a continuation of Ser. No. 97,870, Jul. 27, 1993, abandoned, which is a continuation of Ser. No. 688,659, Apr. 19, 1991, abandoned.

[30] Foreign Application Priority Data

Apr. 26, 1990 [JP] Japan ................................. 2-111414

[51] Int. Cl.$^6$ ............................................ H01L 23/62
[52] U.S. Cl. ........................... 257/355; 330/260; 330/298
[58] Field of Search ............................. 357/23.13, 355; 330/298, 260

[56] References Cited

U.S. PATENT DOCUMENTS

| | | | |
|---|---|---|---|
| 4,066,918 | 1/1978 | Heuner et al. | 357/23.13 |
| 4,440,980 | 4/1984 | Bakker | 330/298 |
| 4,733,285 | 3/1988 | Ishioka et al. | 357/23.13 |
| 4,990,802 | 2/1991 | Smooha | 357/23.13 |

FOREIGN PATENT DOCUMENTS

63-25976  2/1988  Japan.

OTHER PUBLICATIONS

Avery, "A Review of Electrostatic Discharge Mechanisms and On-Chip Protection Techniques to Ensure Device Reliability," *Journal of Electrostatics*, Feb. 24, 1990, No. 2, pp. 111-130.

"Deux Amplificateurs de 20 W a Symetrie Quasi-Complementaire," *Toute Electronique*, Dec. 1970, vol. 37, No. 351, pp. 569-570.

*Primary Examiner*—Ngân V. Ngô
*Attorney, Agent, or Firm*—Greer, Burns & Crain, Ltd.

[57] ABSTRACT

A protection circuit includes a first protection circuit, which is coupled between a signal output terminal of an internal circuit and an external connection terminal and which prevents an abnormal voltage applied to the external connection terminal from being input to the signal output terminal. The protection circuit also includes a second protection circuit, which is coupled between a signal input terminal of the internal circuit and the external connection terminal and which prevents the abnormal voltage applied to the external connection terminal from being input to the signal input terminal. The signal input terminal is operatively coupled to the signal output terminal via the first and second protection circuit and has an impedance higher than that of the signal output terminal.

14 Claims, 7 Drawing Sheets

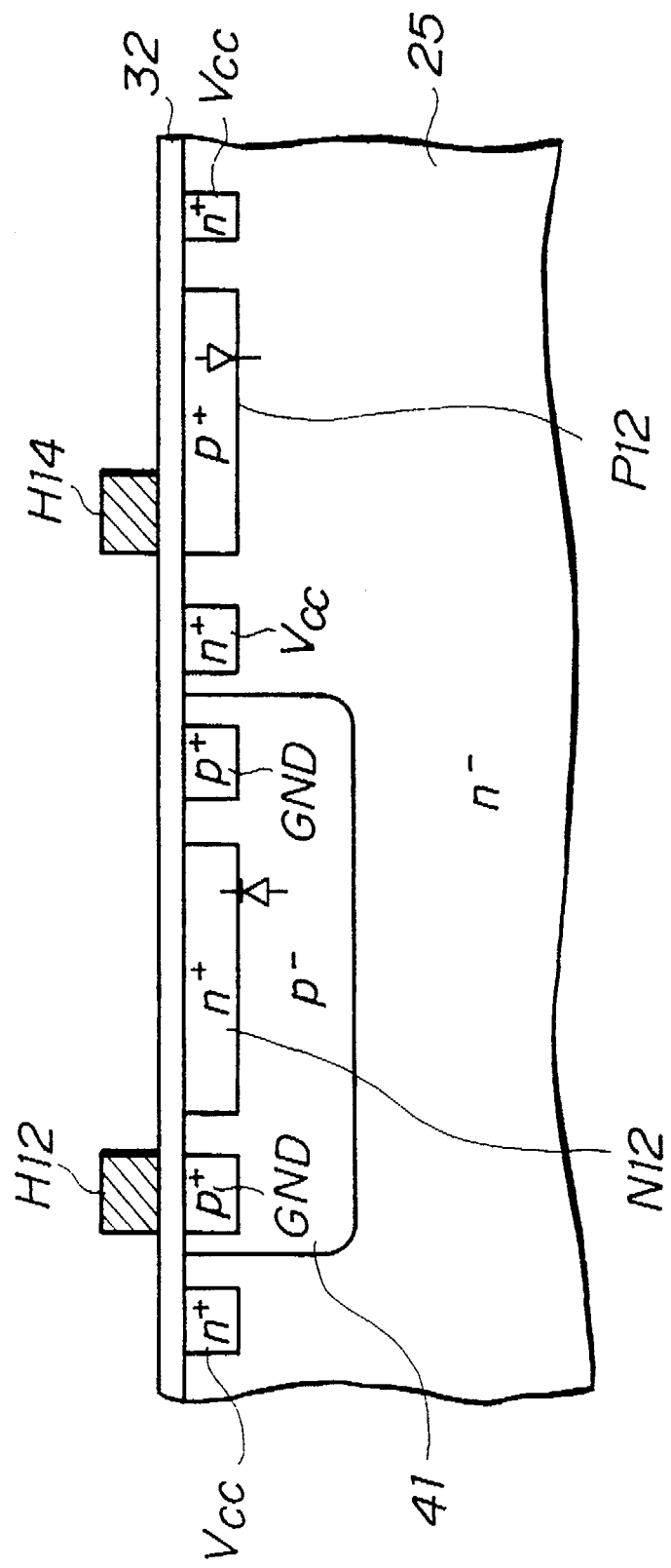

INPUT/OUTPUT PROTECTION CIRCUIT AND SEMICONDUCTOR DEVICE HAVING THE SAME

This application is a continuation of application Ser. No. 08/410,393 filed Mar. 27, 1995, now abandoned, which is a continuation of application Ser. No. 08/097,870 filed Jul. 27, 1993, now abandoned, which is a continuation of application Ser. No. 07/688,659 filed Apr. 19, 1991, now abandoned.

BACKGROUND OF THE PRESENT INVENTION

The present invention generally relates to semiconductor integrated circuits, and more particularly to a protection circuit which protects an internal circuit formed on an LSI chip from an abnormal voltage.

It is necessary to protect internal circuits of LSI devices used in, for example, portable electronic devices from an abnormal voltage, which normally occurs abruptly. Normally, a voltage follower circuit which functions as a buffer amplifier for use in an analog signal is used in portable electronic devices. Such a voltage follower circuit includes an operational amplifier in which its inverting terminal and output terminal must be connected to a terminal in a state where they are short-circuited. The voltage follower circuit must be a low-impedance element, and thus, a low-resistance protection circuit is provided for increasing the electrostatic breakdown voltage of the voltage follower circuit.

FIG. 1 is a circuit diagram of a related analog voltage output circuit, which includes an external connection terminal 1, such as a pad, an internal amplifier 2 formed of an operational amplifier serving as a voltage follower circuit, and an output protection circuit 3. The voltage output circuit shown in FIG. 1 functions to receive an input voltage Ei from a circuit, (not shown) having a high impedance and output an output voltage Eo to a low-impedance circuit so that an amplifier gain of the circuit is equal to 1, that is, Eo=Ei. In other words, the voltage output circuit shown in FIG. 1 functions as a voltage follower circuit which converts a high input impedance into a low output impedance without changing the voltage. For this purpose, the output terminal OT and inverting input terminal IN(−) of the internal amplifier (operational amplifier) 2 are connected to the terminal 1 in the state where they are short-circuited.

Since it is necessary to realize the low output impedance of the voltage output circuit, the output protection circuit 3 is provided which protects the internal amplifier 2 from an abnormal voltage Eh applied to the terminal 1 unexpectedly. The output protection circuit 3 has two diodes Da and Db, and two resistors Ra and Rb. The resistors Ra and Rb, each having a low resistance, are connected in series between the terminal 1 and the output terminal of the internal amplifier 2. The diode Da is connected between the resistor Ra and ground GND, and the diode Db is connected between the resistor Rb and a power supply line set to a voltage Vcc higher than the ground potential.

FIG. 2 illustrates a pattern of the output protection circuit 3. The resistor Ra is formed of a P-type impurity diffusion region 4 formed in a silicon substrate 7 of, for example, N type, and the resistor Rb is formed in a P-type well formed in an N-type impurity diffusion region 5 formed in the silicon substrate 7. The diffusion regions 4 and 5 are connected to a wiring (interconnection) layer 6 via contact holes 8. The diode Da is formed at a PN junction between the impurity diffusion region 4 and the silicon substrate 7, and the diode Db is formed at a PN junction between the impurity diffusion region 5 and the P-type well in the silicon substrate 7.

The abnormal voltage Eh applied to the terminal 1 is attenuated by the resistor RA, and then discharged toward the ground GND via the diode Da. Further, the attenuated abnormal voltage Eh is attenuated by the resistor Rb, and then discharged toward the Vcc line through the diode Db. In this way, the internal amplifier circuit 2 has a high electrostatic breakdown voltage.

It should be noted that since the internal amplifier 2 must have a low output impedance, it is impossible to form each of the resistors Ra and Rb of a resistor having a large resistance higher than, for example, 100 ohms. For this reason, there is a possibility that a charge q which has not passed through the diodes Da and Db and which has not been attenuated by the resistors Ra and Rb reaches the inverting input terminal IN(−) of the internal amplifier 2. The charge q inputs the internal amplifier 2, and may destroy the PN junction of a bipolar transistor forming the inverting input terminal or a gate of a field effect transistor of the internal amplifier 2 forming the inverting input terminal. The above problem occurs more frequently as the size of semiconductor elements becomes smaller or the gate insulating film becomes thinner.

SUMMARY OF THE INVENTION

It is a general object of the present invention to provide an improved protection circuit in which the above-mentioned problems are eliminated.

A more specific object of the present invention is to provide an input/output protection circuit capable of realizing a higher electrostatic breakdown voltage of an internal circuit while keeping a low output impedance.

The above-mentioned objects of the present invention are achieved by a protection circuit comprising: first protection means, coupled between a signal output terminal of an internal circuit and an external connection terminal, for preventing an abnormal voltage applied to the external connection terminal from being input to the signal output terminal; and second protection means, coupled between a signal input terminal of the internal circuit and the external connection terminal, for preventing the abnormal voltage applied to the external connection terminal from being input to the signal input terminal, the signal input terminal being operatively coupled to the signal output terminal via the first and second protection means and having an impedance higher than that of the signal output terminal.

Another object of the present invention is to provide an integrated circuit device having the above-mentioned protection circuit.

This object of the present invention is achieved by an integrated circuit device having the protection circuit which comprises: a semiconductor substrate having a first conduction type; an impurity diffusion region formed in the semiconductor substrate, the impurity diffusion region having a second conduction type different from the first conduction type; a first interconnection line which is in contact with the impurity diffusion region and which is coupled to the external connection terminal; and a second interconnection line which is in contact with the impurity diffusion region and which are electrically coupled to the signal input terminal. The impurity diffusion region forms a resistor, and a junction between the semiconductor substrate and the impurity diffusion region forms a diode.

BRIEF DESCRIPTION OF THE DRAWINGS

Other objects, features and advantages of the present invention will become apparent from the following detailed description when read in conjunction with the accompanying drawings, in which:

FIG. 6B is a cross-sectional view taken along line $VI_B$—$VI_B$ shown in FIG. 6A.

DESCRIPTION OF THE PREFERRED EMBODIMENTS

Figure 3:
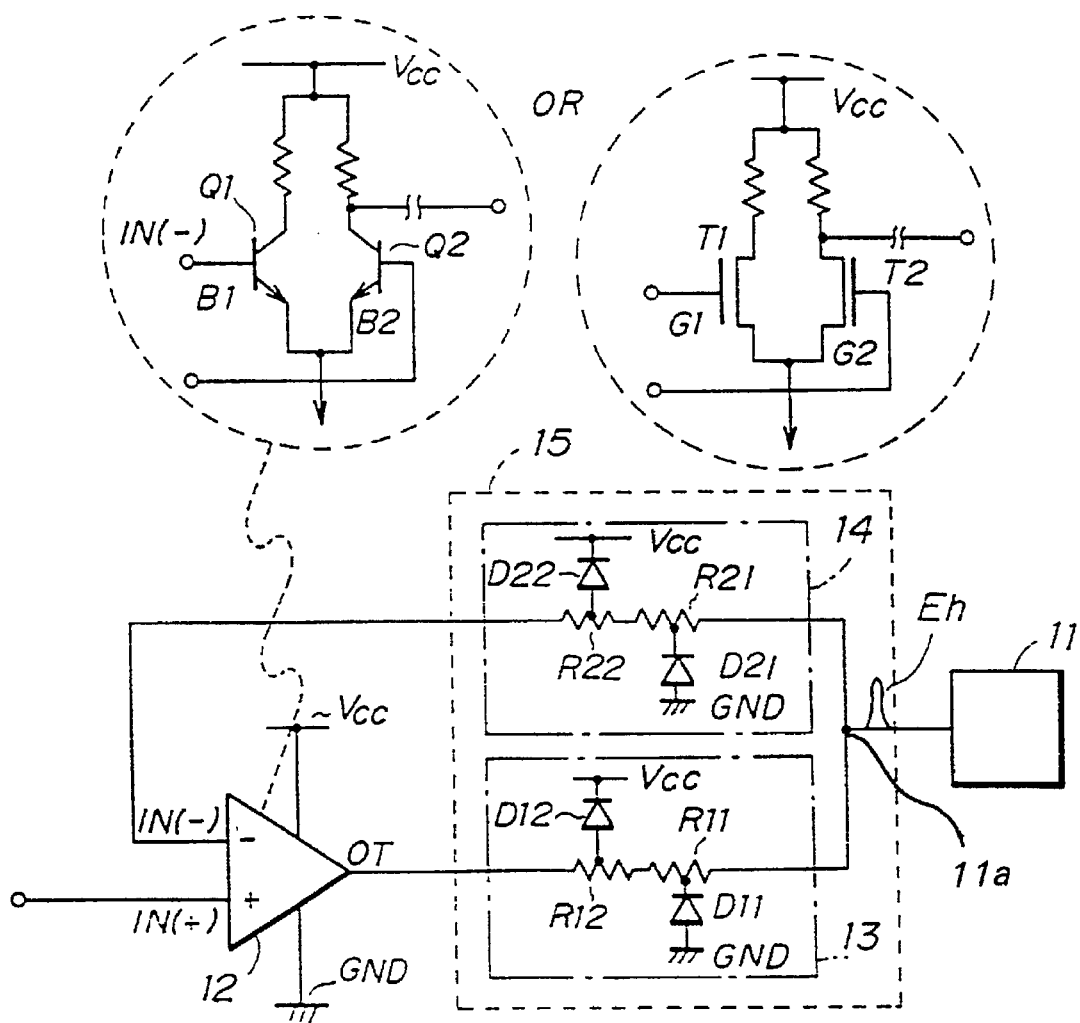
FIG. 3 is a circuit diagram of a voltage follower circuit having an input/output protection circuit according to a first preferred embodiment of the present invention.

A description will now be given of a protection circuit according to a first preferred embodiment of the present invention. FIG. 3 shows a voltage follower circuit having an input/output protection circuit 15, which has a first protection circuit 13 and a second protection circuit 14. In addition to the input/output protection circuit 15, the voltage follower circuit shown in FIG. 3 has an external connection terminal 11, such as a pad, an internal amplifier 12, 12, and internal node 11a. The internal amplifier 12 is formed of, for example, an operational amplifier, which includes bipolar transistors Q1 and Q2 or field effect transistors T1 and T2. A base B1 of the bipolar transistor Q1 functions as an inverting input terminal IN(−) of the internal amplifier, and a base B2 of the bipolar transistor Q2 functions as a non-inverting input terminal IN(+) thereof. When the internal amplifier 12 includes field effect transistors, a gate G1 of the field effect transistor T1 functions as the inverting input terminal IN(−) of the operational amplifier 12, and a gate G2 of the field effect transistor T2 functions as the non-inverting terminal IN(+) thereof. A predetermined signal is applied to the non-inverting terminal IN(+) of the internal amplifier 12. The operational amplifier 12 is connected between the Vcc line and the ground GND.

The first protection circuit 13 has an input terminal connected to the output terminal OT of the internal circuit 12, and an output terminal connected to the terminal 11, via internal node 11a. The second protection circuit has an input terminal connected to the terminal 11 via internal node 11a, and an output terminal connected to the inverting input terminal IN(−) of the internal amplifier 12.

The first protection circuit 13 is composed of two diodes D11 and D12, and two resistors R11 and R12. The diode D11 has an anode grounded and a cathode connected to the resistor R11. The diode D12 has an anode connected to the resistor R12 and a cathode connected to the Vcc line. The resistors R11 and R12 are connected in series between the output terminal OT of the internal amplifier 12 and the terminal 11. It is possible to omit the resistors R11 and R12 if parasitic loads are coupled between the output terminal OT of the internal amplifier 12 and the terminal 11. Such parasitic loads may be formed by lead electrodes of the diodes D11 and D12 or wiring lines thereof.

The second protection circuit 14 is composed of two diodes D21 and D22, and two resistors R21 and R22. The diode D21 has an anode grounded and a cathode connected to the resistor R21. The diode D22 has an anode connected to the resistor R22 and a cathode connected to the Vcc line. The resistors R21 and R22 are connected in series between the internal node 11a and the inverting input terminal IN(−) of the internal amplifier 12.

It is preferable that the sum of the resistance values of the resistors R11 and R12 be between zero ohm and a few tenths of an ohm. The sum of the resistance values of the resistors R21 and R22 must be larger than the sum of the resistance values of the resistors R11 and R12. It is preferable that each of the resistors R21 and R22 has a resistor at least ten to hundred times the resistance of each of the resistors R11 and R12.

The internal amplifier 12 can operate as the voltage follower circuit. An input voltage Ei generated and output by a high-impedance circuit (not shown for the sake of simplicity) is applied to the non-inverting input terminal IN(+) of the internal amplifier 12, which amplifies the input voltage Ei and outputs an output voltage Eo to the resistors R12 and R11. It will be noted that the gain of the internal amplifier 12, Av, is such that Av=[∞+(R21+R22)]/∞=1. The output voltage is then applied to the terminal 11 via the low-impedance circuit including the resistors R12 and R11. The above-mentioned state corresponds to an equivalent state where the output terminal and the inverting input terminal IN(−) of the internal amplifier 12 are short-circuited.

The first protection circuit 13 protects an output transistor of the operational amplifier 12 forming the output terminal OT thereof from the abnormal voltage Eh. The charge of the abnormal voltage Eh is allowed to flow to the Vcc line or ground through the diodes D12 or D11. The second protection circuit 14 protects the transistor Q1 or T1 of the internal amplifier 12 from the abnormal voltage Eh. The charge of the abnormal voltage Eh is attenuated by the resistors R21 and R22 and allow to flow to the Vcc line or ground through the diode D21 or D22. Thus, no abnormal voltage is input to the inverting input terminal IN(−) of the internal amplifier 12.

Figure 1:
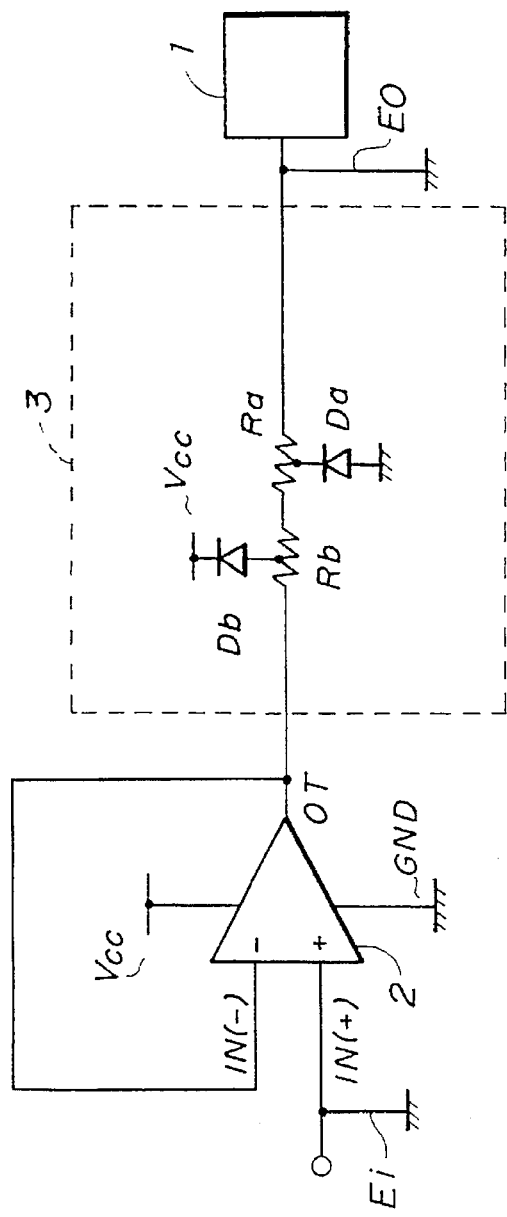
FIG. 1 is a circuit diagram of a related analog voltage output circuit.
Figure 2:
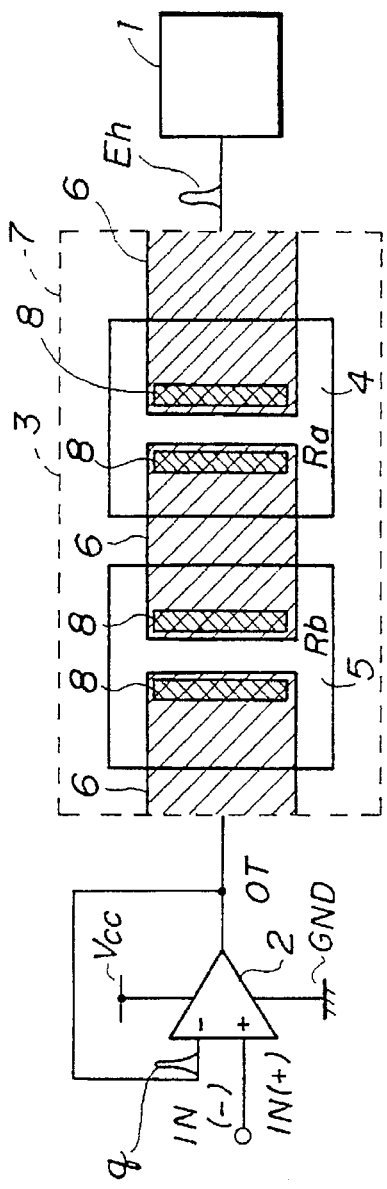
FIG. 2 is a diagram showing a pattern of resistors shown in FIG. 1 on an integrated circuit chip.

It should be noted that the signal obtained at the terminal 11 is fed back to the inverting input terminal IN(−) of the internal amplifier 12. Thus, voltage drops respectively developed across the resistors R11 and R12 are canceled. On the other hand, the signal of the output terminal OT of the internal amplifier 2 shown in FIG. 1 is fed back to the inverting input terminal IN(−) of the internal amplifier 2. Thus, the voltage of the external terminal 1 is affected by the voltage drops respectively developed across the resistors Ra and Rb.

It should also be noted that little current passes through the second protection circuit 14, so that the impedance of the terminal 11 can be reduced without being affected by the existence of the second protection circuit 14.

Figure 4:
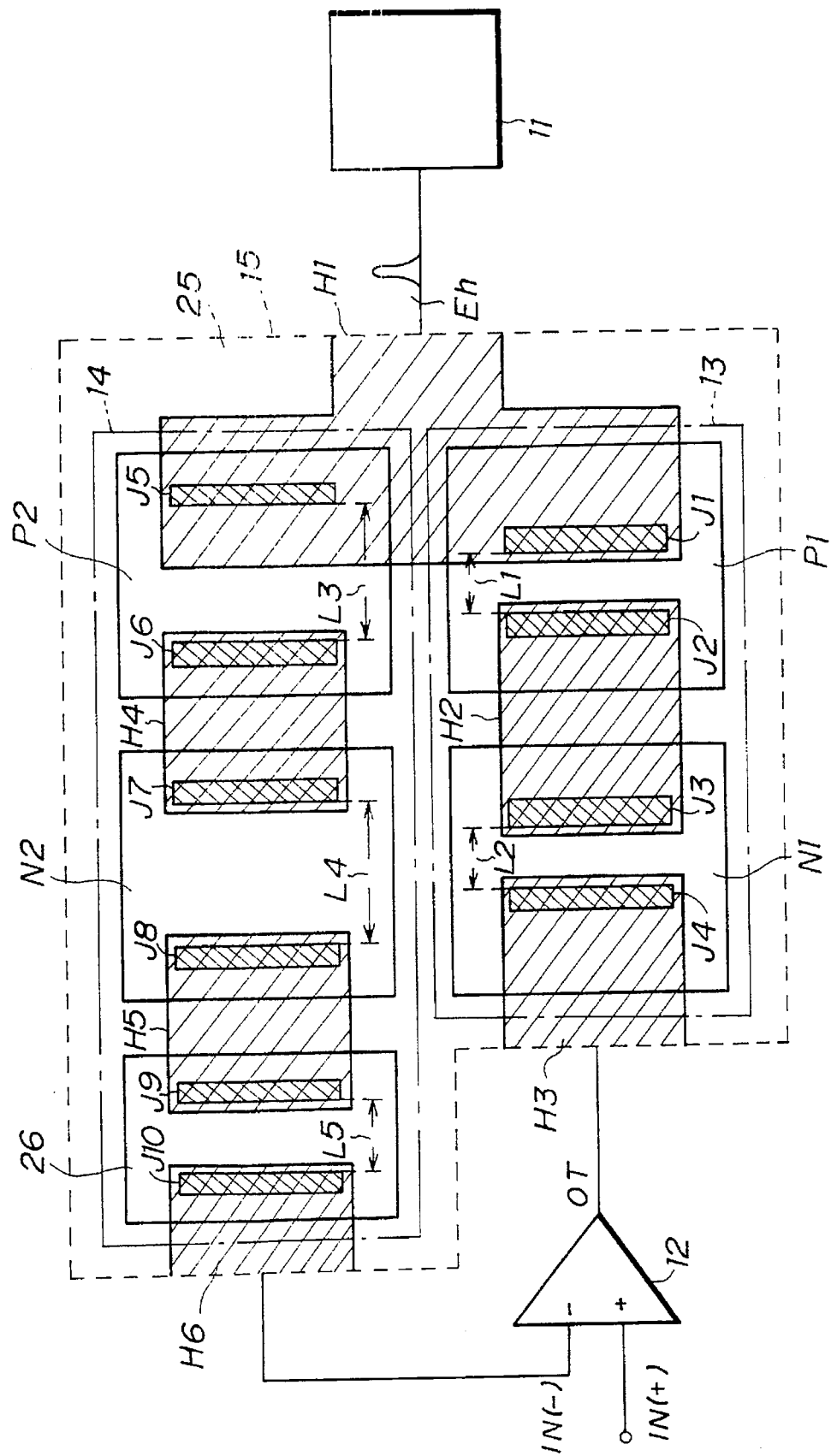
FIG. 4 is a diagram showing a pattern of the input/output protection circuit shown in FIG. 3.

FIG. 4 shows a pattern of resistors including the resistors R11, R12, R21 and R22 of the input/output protection circuit 15. The patterns of the first and second protection circuits 13 and 14 are close to the external terminal 11. As these patterns are closer to the external terminal Eh, the abnormal voltage 11 can be canceled more rapidly.

The first and second protection circuits 13 and 14 are formed in a silicon substrate 25. The first protection circuit 13 has a P-type impurity diffusion region P1 and an N-type impurity diffusion region N1. The P-type impurity diffusion region P1 is electrically in contact with aluminum wiring (interconnection) layers H1 and H2 through contact holes J1 and J2 formed in an insulating film (not shown), respectively. The wiring layer H1 is connected to the external terminal 11. The N-type impurity diffusion region N1 is electrically in contact with wiring layers H2 and H3 via contact holes J3 and J4 formed in the insulating film, respectively. The wiring layer H2 electrically connects the P-type impurity diffusion region P1 and the N-type impurity diffusion region N1. The wiring layer H3 is connected to the output terminal OT of the internal amplifier 12.

The second protection circuit 14 has a P-type impurity diffusion region P2, an N-type impurity diffusion region N2 and a high-resistance region 26. The P-type impurity diffusion region P2 is electrically in contact with the wiring layer Hi through a contact hole J5 formed in the insulating layer, and in contact with an aluminum wiring layer H4 through a contact hole J6. The N-type impurity diffusion layer N2 is electrically in contact with the wiring layer H4 through a contact hole J7 as well as an aluminum wiring layer H5 through a contact hole J8. The high-resistance layer 26 is electrically in contact with the wiring layer H5 through a contact hole J9 as well as an aluminum wiring layer H6 through a contact hole J10. The wiring layer H6 is connected to the inverting input terminal IN(−) of the internal amplifier 12. It will be seen from the above that the second protection circuit 14 has three resistors connected in series.

Distance L1 between the contact holes J1 and J2 and distance L2 between the contact holes J3 and J4 are smaller than distance L3 between the contact holes J5 and J6, distance L4 between the contact holes J7 and J8, and distance between the contact holes J9 and J10. With this arrangement, it is possible to obtain the resistance of the second protection circuit 14 greater than that of the first protection circuit 13 with an identical mask. The resistors R11 and R12 may have an identical resistance or different resistances. Similarly, the resistors R21 and R22 may have an identical resistance or different resistances.

The diode D11 is formed at a junction between the P-type impurity diffusion layer P1 and the silicon substrate 25, and the diode D12 is formed at a junction between the N-type impurity diffusion layer N1 and a P-type well (not shown for the sake of simplicity) formed in the silicon substrate 25 when it is of the N type. The diode D21 is formed at a junction between the P-type impurity diffusion layer P2 and the silicon substrate 25, and the diode D22 is formed at a junction between the N-type impurity diffusion region N2 and the P-type well.

The abnormal voltage Eh applied to the external terminal 11 is transferred to the P-type impurity diffusion regions P1 and P2 via the wiring line H1, and attenuated (absorbed) therein. In addition, the charges of the abnormal voltage Eh flow to the ground via the diodes D11 and D21. The remaining charges are transferred to the N-type impurity diffusion regions N1 and N2, and attenuated therein. In addition, the remaining charges flow to the Vcc line via the diodes D12 and D22. The still remaining charges are attenuated in the high-resistance region 26. As a result, the inverting input terminal and the output terminal of the internal amplifier 12 are not affected by the existence of the abnormal voltage Eh.

Figure 5:
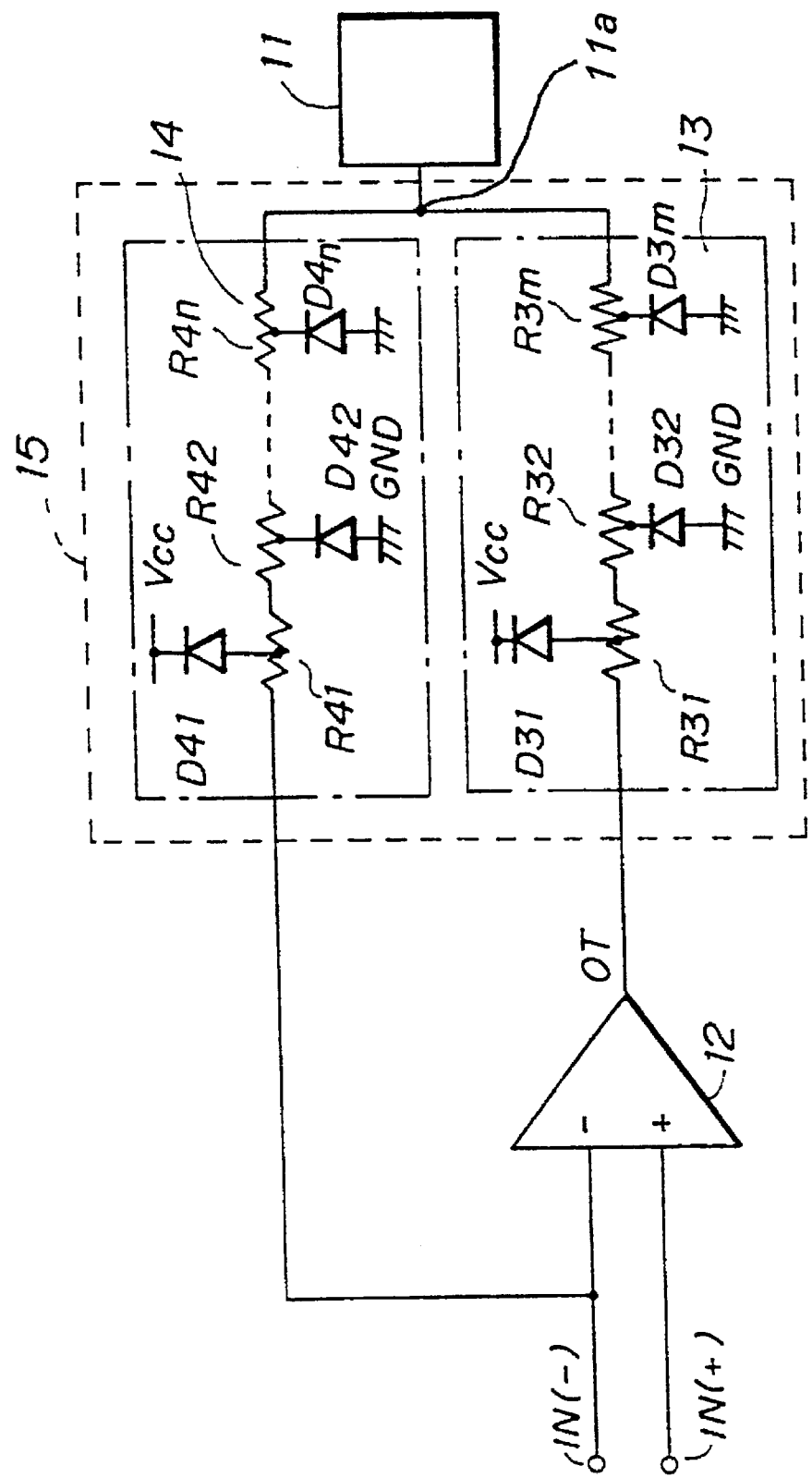
FIG. 5 is circuit diagram of a variation of the input/output protection circuit shown in FIG. 3.

The first protection circuit 13 can be composed of an arbitrary number of resistors and diodes. Similarly, the second protection circuit 14 can be composed of an arbitrary number of resistors and diodes. As shown in FIG. 5, the first protection circuit 13 is composed of m resistors R31, R32, ..., R3m, and m diodes D31, D32, ..., D3m where m is an integer. Similarly, the second protection circuit 14 is composed of n resistors R41, R42, ..., R4n, and n diodes D41, D42, ..., D4n where n is an integer. The diodes D32, ..., D3m of the first protection circuit 13 have anodes grounded and cathodes connected to the resistors R32, ... , R3m. Similarly, the diodes D42, ..., D4n of the second protection circuit 14 have anodes grounded and cathodes connected in the resistors R42, ..., R4n, respectively. The number of resistors in each of the first and second protection circuits 13 and 14 may be different from that of diodes.

Figure 6A:
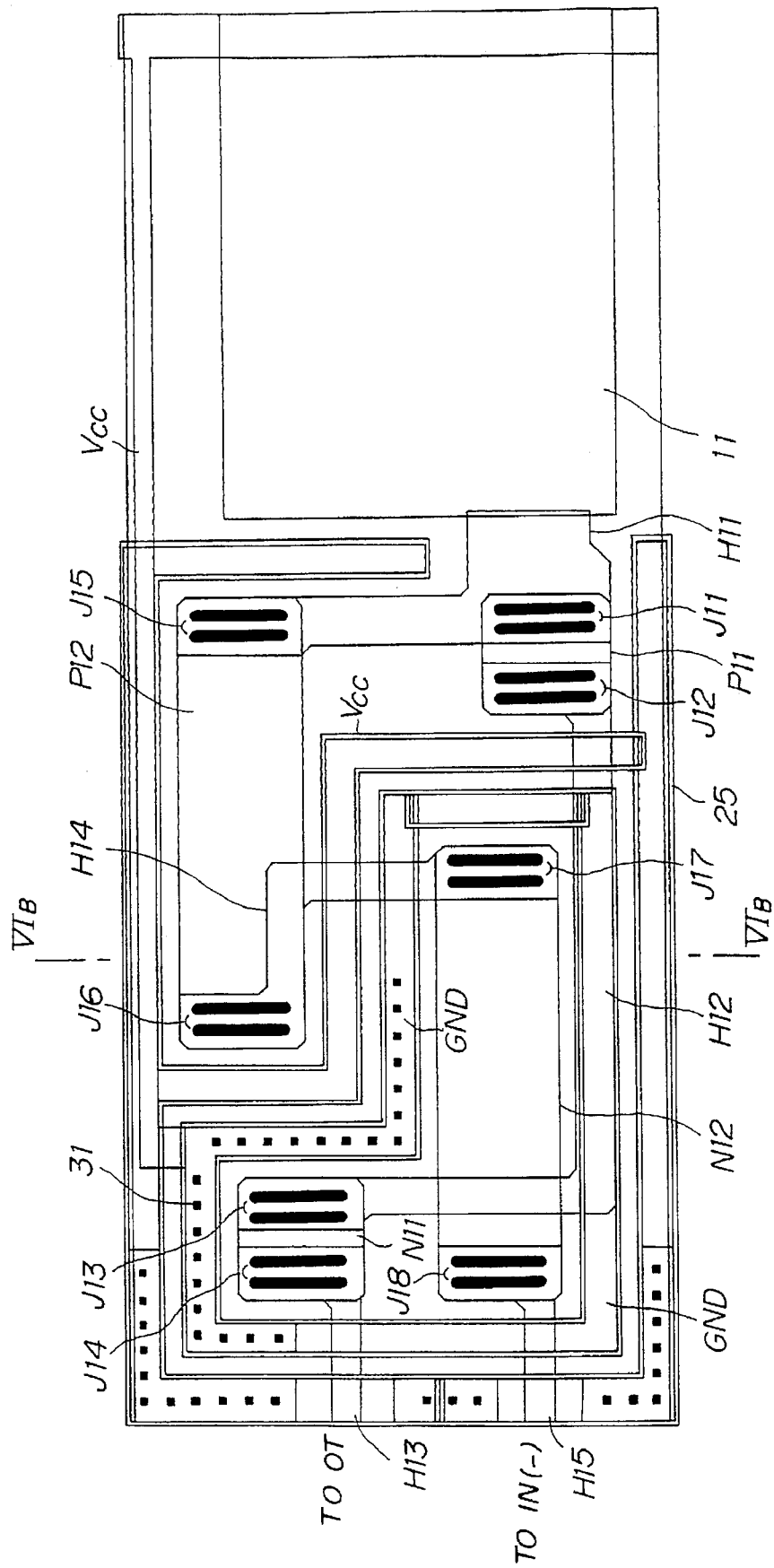
FIG. 6A is a plan view of the input/output protection circuit shown in FIG. 3.

FIG. 6A shows another pattern of the first and second protection circuits 13 and 14 shown in FIG. 3, and FIG. 6B is a cross-sectional view taken along line $VI_B$—$VI_B$ shown in FIG. 6A. The first protection circuit 13 has a P-type impurity diffusion region P11 formed in the silicon substrate 25 of the N type, and an N-type impurity diffusion region N11 formed in a P-type well 41 formed in the silicon substrate 25. An aluminum wiring layer H11 connected to the external terminal (pad) 11 is in contact with the P-type impurity diffusion region P11 through contact holes J11 formed in an insulating film 32. The P-type impurity diffusion region P11 and the N-type impurity diffusion region N11 are electrically connected trough an aluminum wiring line H12, which is electrically in contact with the P-type impurity diffusion region P11 through contact holes J12 formed in the insulating film 32 and the N-type impurity diffusion region N11 through contact holes J13 formed therein. The N-type impurity diffusion region N11 is electrically connected to the output terminal OT of the internal amplifier 12 via an aluminum wiring layer H13, which is electrically in contact with the N-type impurity diffusion region N11 via contact holes J14 formed in the insulating film 32.

The second protection circuit 14 has a P-type impurity diffusion region P12 formed in the silicon substrate 25, and an N-type impurity diffusion region N12 formed in the P-type well 41. The wiring layer H11 connects the external terminal 11 to the P-type impurity diffusion region P12, which is electrically in contact with the wiring layer H11 through contact holes J15. An aluminum wiring line H14, which is electrically in contact with the P-type impurity diffusion region P12 through contact holes J16, is in contact with the N-type impurity diffusion region N12 via contact holes J17. An aluminum wiring line H15, which is in contact with the N-type impurity diffusion region N12, is connected to the inverting input terminal of the internal amplifier 12. A reference 31 indicates a well contact. A P-type impurity diffusion region (GND) is provided in the P-type well 41, as shown in FIG. 6B. An N-type impurity diffusion region (Vcc) is provided in the silicon substrate 25, as shown in FIG. 6B. As shown in FIG. 6B, diodes are formed at PN junctions.

Figure 7:
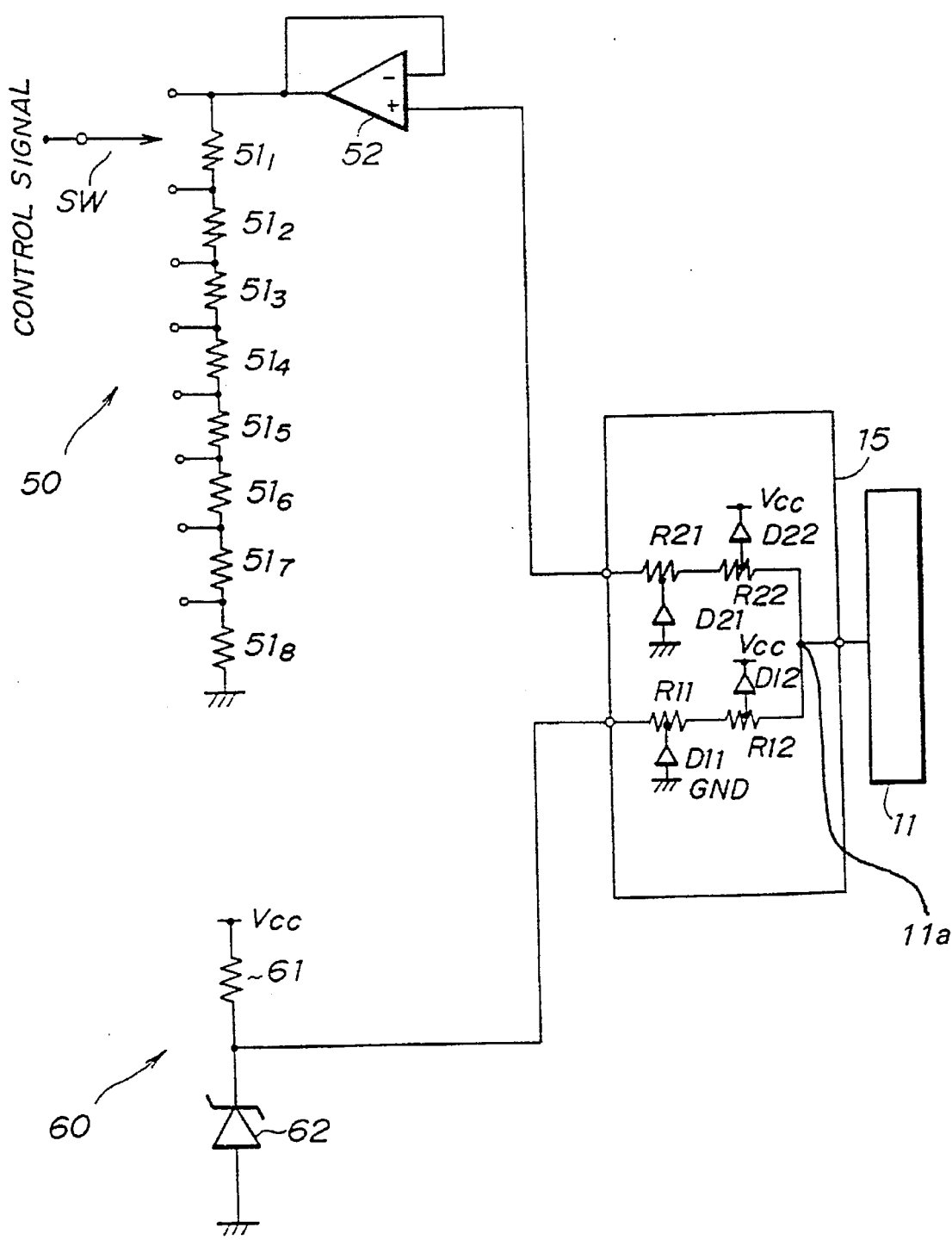
FIG. 7 is a circuit diagram illustrating a second preferred embodiment of the present invention.

A description will now be given of a second preferred embodiment of the present invention with reference to FIG. 7. The second embodiment shown in FIG. 7 includes a digital-to-analog (D/A) converter 50, a constant voltage generation circuit 60, and the aforementioned input/output protection circuit 15. The D/A converter 50 is composed of a resistors $51_1$–$51_8$ connected in series, a switch SW and an operational amplifier 52. The inverting input terminal of the operational amplifier 52 is directly connected to the output terminal thereof. A control signal generated by an internal circuit (not shown) of the D/A converter 50 is applied to the switch SW so that the switch SW selects one of stationary contacts connected to respective connection nodes where adjacent resistors are connected. The constant voltage generation circuit 60 includes a resistor 61 and a Zener diode 62 connected in series between the Vcc line and ground.

Conventionally, a constant voltage is directly applied to the non-inverting input terminal of the operational amplifier 52. In order to examine whether or not the constant voltage generation circuit 60 generates a predetermined constant voltage, conventionally, the external terminal 11 is directly connected between the constant voltage generation circuit 60 and the non-inverting input terminal of the operational amplifier 52.

On the other hand, the second embodiment of the present invention has the input/output protection circuit 15 provided between the internal node 11a and the constant voltage generation circuit 60 and also between the internal node 11a and the non-inverting terminal of the operational amplifier 52. An abnormal voltage applied to the terminal 11 is canceled by the input/output protection circuit 15, so that the operational amplifier 52 is not affected by the abnormal voltage.

The present invention is not limited to the specifically disclosed embodiments, and variations and modifications may be made without departing from the scope of the present invention.

What is claimed is:

1. A semiconductor integrated circuit device comprising:
   a semiconductor substrate;
   an internal circuit, formed on said semiconductor substrate, including an input circuit, and an output circuit;
   an external electrode, formed on said semiconductor substrate, for outputting an output signal provided by the output circuit;
   an internal node connected to said external electrode;
   an internal output signal path connected between said external electrode and the output circuit via said internal node;
   an internal input signal path connected between said external electrode and the input circuit via said internal node;
   internal first protection means, connected to said internal node and formed on said semiconductor substrate, for protecting the output circuit from destruction by an abnormal voltage applied to said external electrode;
   internal second protection means, connected to said internal node and formed on said semiconductor substrate, for protecting the input circuit from destruction by said abnormal voltage applied to said external electrode, said second protection means having an impedance higher than that of said first protection means
   wherein said semiconductor substrate is semiconductor material of a first conduction type, and said second protection means includes:
      a first impurity diffusion region formed in said semiconductor substrate, said first impurity diffusion region having a second conduction type different from said first conduction type;
      a first interconnection line which is in contact with said first impurity diffusion region and which is coupled to said external electrode; and
      a second interconnection line which is in contact with said first impurity diffusion region and which is electrically coupled to said input signal path, and
   wherein:
   said first impurity diffusion region forms a resistor; and
   a junction between said semiconductor substrate and said first impurity diffusion region forms a diode.

2. A semiconductor integrated circuit device as claimed in claim 1, wherein said second protection means further comprises:
   a well region formed in said semiconductor substrate, said well region having a third conduction type different from said first conduction type;
   a second impurity diffusion region formed in said semiconductor substrate;
   said third interconnection line being coupled to said input signal path through said second impurity diffusion region; and
   a fourth interconnection line which is in contact with said second impurity diffusion region and which is electrically coupled to said input signal path, and
   wherein:
   said second impurity diffusion region forms a resistor; and
   a junction between said well region and said second impurity diffusion region forms a diode.

3. A semiconductor integrated circuit device as claimed in claim 2, wherein said first protection means comprises:
   a third impurity diffusion region and a fourth impurity diffusion region having mutually different conduction types, one of said third and fourth impurity diffusion regions being formed in a well region, and the other one of said third and fourth impurity diffusion regions being directly formed in said semiconductor substrate provided in common for said first and second protection means;
   a fifth interconnection line connecting said external terminal and said third impurity diffusion region; and
   a sixth interconnection line connecting said third, and fourth impurity diffusion regions.

4. A semiconductor integrated circuit device as claimed in claim 3, wherein said first interconnection line is the same as said fourth interconnection line.

5. A semiconductor integrated circuit device as claimed in claim 3, wherein each of said first and second impurity diffusion regions has a size greater than each of said third and fourth impurity diffusion regions.

6. A semiconductor integrated circuit device as claimed in claim 3, wherein said first impurity diffusion region and said third impurity diffusion regions are close to said external terminal.

7. A semiconductor device comprising:
   a semiconductor substrate having:
   an external electrode for communicating an output signal;
   an internal amplifier circuit thereon formed of an operational amplifier serving as a voltage follower, having an inverting input, a non-inverting input and an output, said inverting input being operatively coupled to said output via an internal feedback path formed thereon through an internal node at said output to said inverting input; said internal feedback path including said internal node;
   said internal node being operatively coupled to said external electrode;
   internal first protection means thereon, operatively coupled between said internal node and said output for protecting the output from destruction by an abnormal voltage applied to said external electrode; and
   internal second protection means thereon, operatively coupled between said inverting input and said internal node for protecting the inverting input from destruction by an abnormal voltage applied to said external electrode, such that said first and second protection means are in said internal feedback path, and wherein said second protection means has a higher impedance than that of said first protection means.

8. A semiconductor device comprising:

an external electrode for communicating an output signal;

an internal amplifier circuit formed of an operational amplifier serving as a voltage follower, having an inverted input, a non-inverting input and an output, wherein said inverting input is not directly connected to said output via an internal feedback path;

first protection means operatively coupled between said external electrode and said output for protecting the output from destruction by an abnormal voltage applied to said external electrode; and second protection means operatively coupled between said inverting input and said external electrode for protecting the inverting input from destruction by an abnormal voltage applied to said external electrode, wherein said second protection means has a higher impedance than that of said first protection means.

9. A semiconductor device as claimed in claim 7, wherein said second protection means comprises:

a resistor coupled between said internal node and said inverting input; and a diode having a cathode coupled to said resistor, and an anode connectable to receive a predetermined voltage.

10. A semiconductor device as claimed in claim 7, wherein said second protection means comprises:

a resistor coupled between said internal node and said inverting input; and a diode having a cathode connectable to receive a predetermined voltage, and an anode coupled to said resistor.

11. A semiconductor device as claimed in claim 7, wherein said second protection means comprises:

a first resistor and a second resistor coupled in series between said internal node and said inverting input;

a first diode having a cathode coupled to said first resistor, and an anode connectable to receive a first predetermined voltage; and a second diode having a cathode connectable to receive a second predetermined voltage, and an anode coupled to said second resistor.

12. A semiconductor device as claimed in claim 7, wherein:

said first protection means comprises a first resistance element coupled between said internal node and said output;

said second protection means comprises a second resistance element coupled between said internal node and said inverting input; and said second resistance element has a resistance greater than that of said first resistance element.

13. A semiconductor device as claimed in claim 7, wherein said first protection means comprises:

a first resistor and a second resistor coupled in series between said internal node and said output;

a first diode having a cathode coupled to said first resistor, and an anode connectable to receive a first predetermined voltage; and a second diode having a cathode connectable to receive a second predetermined voltage, and an anode coupled to said second resistor.

14. A semiconductor device as claimed in claim 7, wherein said operational amplifier comprises a field effect transistor having a gate functioning as said inverting input.

* * * * *

UNITED STATES PATENT AND TRADEMARK OFFICE
CERTIFICATE OF CORRECTION

PATENT NO. : 5,650,652
DATED : Jul. 22, 1997
INVENTOR(S) : Mizutani et al.

It is certified that error appears in the above-identified patent and that said Letters Patent is hereby corrected as shown below:

Column 3, line 30, delete "12," (first occurrence) therefor.

Column 3, line 49, delete "11," and insert --11-- therefor.

Column 4, line 59 delete "Eh" and insert --11-- therefor.

Column 4, line 60, delete "11" and insert --Eh-- therefor.

UNITED STATES PATENT AND TRADEMARK OFFICE
CERTIFICATE OF CORRECTION

PATENT NO. : 5,650,652
DATED : Jul. 22, 1997
INVENTOR(S) : Mizutani et al.

It is certified that error appears in the above-indentified patent and that said Letters Patent is hereby corrected as shown below:

Column 5, line 14, delete "Hi" and insert --H1-- therefor.

Column 6, line 21, delete "trough" and insert --through-- therefor.

Column 8, line 28, delete "third," and insert --third-- therefor.

Signed and Sealed this

Twenty-eighth Day of July, 1998

*Attest:*

BRUCE LEHMAN

*Attesting Officer*   *Commissioner of Patents and Trademarks*